United States Patent
Fujii et al.

(10) Patent No.: US 11,165,011 B2
(45) Date of Patent: Nov. 2, 2021

(54) PIEZOELECTRIC ELEMENT AND METHOD FOR MANUFACTURING PIEZOELECTRIC ELEMENT

(71) Applicant: FUJIFILM Corporation, Tokyo (JP)

(72) Inventors: Takamichi Fujii, Kanagawa (JP); Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 336 days.

(21) Appl. No.: 16/352,770

(22) Filed: Mar. 13, 2019

(65) Prior Publication Data
US 2019/0214541 A1 Jul. 11, 2019

Related U.S. Application Data

(60) Division of application No. 15/137,142, filed on Apr. 25, 2016, now abandoned, which is a continuation of
(Continued)

(30) Foreign Application Priority Data
Oct. 28, 2013 (JP) .................... 2013-223376

(51) Int. Cl.
*H01L 41/083* (2006.01)
*H01L 41/047* (2006.01)
(Continued)

(52) U.S. Cl.
CPC .......... *H01L 41/083* (2013.01); *B06B 1/0611* (2013.01); *B81C 1/00158* (2013.01);
(Continued)

(58) Field of Classification Search
CPC ... H01L 41/083; H01L 41/0471; H01L 41/27; B06B 1/0611
See application file for complete search history.

(56) References Cited

U.S. PATENT DOCUMENTS

2005/0140249 A1 6/2005 Kita et al.
2006/0028095 A1 2/2006 Maruyama et al.
(Continued)

FOREIGN PATENT DOCUMENTS

EP 2 579 347 A2 4/2013
JP 2005-203750 A 7/2005
(Continued)

OTHER PUBLICATIONS

JP Office Action dated Feb. 13, 2018, from corresponding JP Appl No. 2017-091823, with English translation, 9 pp.
(Continued)

*Primary Examiner* — Bryan P Gordon
(74) *Attorney, Agent, or Firm* — Studebaker & Brackett PC

(57) ABSTRACT

Provided are a piezoelectric element having high stability, which operates with high efficiency, and a method for manufacturing the piezoelectric element. The piezoelectric element (10) has a laminate structure in which a first electrode (14), a first piezoelectric film (16), a second electrode (18), an adhesion layer (20), an interlayer (22), a third electrode (24), a second piezoelectric film (26), and a fourth electrode (28) are laminated in this order on a silicon substrate (12). The interlayer (22) is formed of a material different from that of the second electrode (18) and has a thickness of 0.4 μm to 10 μm. A device having a diaphragm structure or a cantilever structure is formed by removing a part of the silicon substrate (12). The respective layers (14 to 28) laminated on the silicon substrate (12) can be formed using a thin film formation method represented by a vapor phase epitaxial method.

15 Claims, 11 Drawing Sheets

Related U.S. Application Data application No. PCT/JP2014/077958, filed on Oct. 21, 2014.

(51) Int. Cl.
*H01L 41/09* (2006.01)
*H01L 41/297* (2013.01)
*H01L 41/316* (2013.01)
*B06B 1/06* (2006.01)
*B81C 1/00* (2006.01)
*H01L 41/08* (2006.01)
*H01L 41/27* (2013.01)

(52) U.S. Cl.
CPC ...... *H01L 41/0471* (2013.01); *H01L 41/0478* (2013.01); *H01L 41/0805* (2013.01); *H01L 41/0831* (2013.01); *H01L 41/094* (2013.01); *H01L 41/0973* (2013.01); *H01L 41/27* (2013.01); *H01L 41/297* (2013.01); *H01L 41/316* (2013.01)

(56) References Cited

U.S. PATENT DOCUMENTS

| | | | |
|---|---|---|---|
| 2008/0089832 A1* | 4/2008 | Aoki | H01L 41/0815 423/608 |
| 2011/0148255 A1 | 6/2011 | Nihei | |
| 2011/0204750 A1* | 8/2011 | Fujii | H01L 41/331 310/330 |
| 2012/0286801 A1 | 11/2012 | Hori et al. | |
| 2013/0026021 A1 | 1/2013 | Hori et al. | |
| 2013/0038335 A1* | 2/2013 | Hori | H01H 57/00 324/537 |
| 2013/0099627 A1* | 4/2013 | Fujii | H01L 41/0471 310/311 |
| 2013/0300254 A1 | 11/2013 | Fujii et al. | |
| 2015/0263263 A1* | 9/2015 | Akiyama | B41J 2/1629 347/68 |

FOREIGN PATENT DOCUMENTS

| | | |
|---|---|---|
| JP | 2006-048302 A | 2/2006 |
| JP | 2008-263158 A | 10/2008 |
| JP | 2011-129369 A | 6/2011 |
| JP | 2011-176038 A | 9/2011 |
| JP | 2012-238669 A | 12/2012 |
| JP | 2012-238817 A | 12/2012 |
| JP | 2013-26608 A | 2/2013 |
| JP | 2013-080886 A | 5/2013 |
| JP | 2013-197496 A | 9/2013 |

OTHER PUBLICATIONS

An Office Action; "Decision to Grant a Patent" issued by the Japanese Patent Office dated May 21, 2018, which corresponds to Japanese Patent Application No. 2017-091823 and is related to U.S. Appl. No. 15/137,142; with English translation.
An Office Action; "Decision of Refusal," issued by the Japanese Patent Office dated Feb. 9, 2017, which corresponds to Japanese Patent Application No. 2013-223376 and is related to U.S. Appl. No. 15/137,142; with English language translation.
An Office Action; "Notification of Reasons for Refusal," issued by the Japanese Patent Office dated Sep. 2, 2016, which corresponds to Japanese Patent Application No. 2013-223376 and is related to U.S. Appl. No. 15/137,142; with English language translation.
Written Opinion of PCT/JP2014/077958 dated Nov. 25, 2014.
International Search Report of PCT/JP2014/077958 dated Nov. 25, 2014.

\* cited by examiner

FIG. 9

| | $t_1$ | $t_2$ | $t_v$ | DISPLACEMENT@ $V_1=V_2=10V(\mu m)$ | VARIATION IN DISPLACEMENT (SINE WAVE CONTAINING NO OFFSET) |
|---|---|---|---|---|---|
| EXAMPLE 1 | 2.5 | 3.0 | 3.0 | 533 | AA |
| EXAMPLE 2-1 | 2.0 | 2.4 | 0.5 | 1310 | A |
| EXAMPLE 2-2 | 2.0 | 2.4 | 2.2 | 876 | AA |
| EXAMPLE 2-3 | 2.0 | 2.4 | 5.0 | 443 | AA |
| EXAMPLE 3 | 1.0 | 1.0 | 10.0 | 220 | AA |
| COMPARATIVE EXAMPLE 1 | 0 | 3.0 | 5.5 | 224 | AA |
| COMPARATIVE EXAMPLE 2-1 | 2.0 | 2.4 | 0.3 | 1360 | C |
| COMPARATIVE EXAMPLE 2-2 | 0 | 2.4 | 5.0 | 297 | AA |
| COMPARATIVE EXAMPLE 3 | 0 | 1.0 | 11.0 | 100 | AA |

FIG. 10

| | $t_1$ | $t_2$ | $t_v$ | WARPING |
|---|---|---|---|---|
| EXAMPLE 1 | 2.5 | 3.0 | 3.0 | A |
| EXAMPLE 2-1 | 2.0 | 2.4 | 0.5 | A |
| EXAMPLE 3 | 1.0 | 1.0 | 10.0 | A |
| EXAMPLE 4 | 1.5 | 2.8 | 2.0 | A |
| COMPARATIVE EXAMPLE 1 | 0 | 3.0 | 5.5 | C |
| COMPARATIVE EXAMPLE 2-2 | 0 | 2.4 | 5.0 | C |
| EXAMPLE 5 | 1.5 | 3.5 | 2.0 | C |
| EXAMPLE 6 | 3.5 | 1.5 | 2.0 | C |

PIEZOELECTRIC ELEMENT AND METHOD FOR MANUFACTURING PIEZOELECTRIC ELEMENT

CROSS-REFERENCE TO RELATED APPLICATIONS

The present application is a Divisional of U.S. patent application Ser. No. 15/137,142 filed on Apr. 25, 2016, which is a Continuation of International Application No. PCT/JP2014/077958 filed on Oct. 21, 2014 claiming priority under 35 U.S.C § 119(a) to Japanese Patent Application No. 2013-223376 filed on Oct. 28, 2013. Each of the above applications is hereby expressly incorporated by reference, in their entirety, into the present application.

BACKGROUND OF THE INVENTION

1. Field of the Invention

The present invention relates to a piezoelectric element and a method for manufacturing a piezoelectric element. In particular, the present invention relates to a piezoelectric element using a piezoelectric thin film material, which is used for various uses such as an actuator, a sensor, or a power generation device, and a method for manufacturing the same.

2. Description of the Related Art

As a piezoelectric actuator of the related art, a unimorph actuator having a structure in which an upper electrode, a piezoelectric body, a lower electrode, and a vibration plate are laminated is known. The generative force of the unimorph actuator is substantially determined from a product of a piezoelectric constant of a piezoelectric body and an applied voltage. Since the piezoelectric constant is determined depending on the material, there is a physical limit in the generative force of the unimorph actuator.

As an actuator having a higher generative force than that of the unimorph actuator, JP2005-203750A discloses an actuator which has a bimorph structure having a configuration in which two piezoelectric layers are laminated (FIG. 7 of JP2005-203750A). The bimorph actuator disclosed in JP2005-203750A is manufactured by bonding two structures including a piezoelectric thin film element to each other (refer to paragraphs "0070" to "0071" of JP2005-203750A).

In addition, JP2006-48302A discloses a configuration in which a part of a piezoelectric bimorph actuator using a laminated piezoelectric body is used as a force detecting sensor. The bimorph actuator disclosed in JP2006-48302A is manufactured by bonding two film-shaped piezoelectric bodies to front and back surfaces of a conductive member for a common electrode (refer to paragraph "0074" and FIG. 3 of JP2006-48302A).

JP2013-80886A discloses a configuration in which two piezoelectric films are formed using a vapor phase epitaxial method with a metal oxide interposed therebetween. JP2013-80886A discloses a method for manufacturing an actuator having a diaphragm structure, the method including: forming a lower electrode, a first piezoelectric film, a metal oxide film, a metal film, a second piezoelectric film, and an upper electrode on a silicon on insulator (SOI) substrate; and removing a part of a silicon layer by etching a back surface of the SOI substrate.

SUMMARY OF THE INVENTION

The piezoelectric actuators of the related art disclosed in JP2005-203750A and JP2006-48302A are manufactured by bonding two piezoelectric bodies to each other. Therefore, the manufacturing process is complicated, and the manufacturing costs are high. In addition, in the configuration disclosed in JP2013-80886A using the SOI substrate, the SOI substrate is expensive.

Further, in the configuration disclosed in JP2013-80886A, when the actuator is driven in a bending mode, there is a significant difference in thermal expansion coefficient between an underlying silicon layer functioning as a vibration plate and a piezoelectric film which is laminated on the silicon layer. Therefore, warping is likely to occur due to a temperature variation, and drive characteristics or a sensor output is likely to vary.

If the underlying silicon layer functioning as a vibration plate is not provided in the configuration disclosed in JP2013-80886A, that is, if a laminated piezoelectric body which does not include a member functioning as a vibration plate is provided alone, the rigidity of a movable portion deteriorates. Therefore, the actuator cannot be used as a driving source of a device having a high resonance frequency. In addition, in the configuration in which the laminated piezoelectric body which does not include a vibration plate is provided alone, the rigidity deteriorates. Therefore, when there is a difference in residual stress between two piezoelectric films or a difference in thickness between two piezoelectric films, a large amount of initial bending occurs.

On the other hand, when a thin film having high rigidity is manufactured using a vapor phase epitaxial method in order to improve the rigidity of a movable portion, cracking, peeling, or the like occurs, and a desired thin film laminate structure cannot be formed.

Further, if a bimorph actuator is manufactured by adopting the configuration in which the underlying silicon layer functioning as a vibration plate is removed in the configuration disclosed in JP2013-80886A, only the thin electrode is present between the two piezoelectric films. Therefore, during a bending operation, a stress neutral surface (surface having a stress value of 0) is likely to be present in one of the piezoelectric films, and a variation in displacement increases.

The summary of the problems of the related art are as follows.

(1) The unimorph actuators of the related art have a limit in generative force.

(2) In a case where a bimorph actuator is manufactured by bonding piezoelectric bodies to each other as disclosed in JP2005-203750A and JP2006-48302A, the manufacturing process is complicated.

(3) The SOI substrate is more expensive than a typical silicon substrate (non-SOI substrate) not having an SOI structure. Therefore, when the SOI substrate is used, the costs are high.

(4) If a laminated piezoelectric body is provided alone by removing the underlying silicon layer functioning as a vibration plate in the configuration disclosed in JP2013-80886A, the rigidity of a movable portion deteriorates. Therefore, the actuator cannot be used as a driving source of a device having a high resonance frequency. In addition, in the configuration in which a laminated piezoelectric body is provided alone, a large amount of initial bending is likely to occur.

(5) When a thin film having high rigidity is formed using, for example, a vapor phase epitaxial method, cracking or peeling is likely to occur. If an interlayer thermal expansion coefficient, crystal orientation, stress, and the like in a thin film laminate structure are not optimized, warping or cracking is likely to occur, and it is difficult to manufacture a device having high durability and reliability.

(6) Further, in the configuration disclosed in JP2013-80886A, only the thin electrode is interposed between the two piezoelectric films. Therefore, during a bending operation, a stress neutral surface is likely to be present in one of the piezoelectric films, and a variation in displacement increases.

Irrespective of the uses, the above-described problems can be recognized as problems common to various piezoelectric elements, for example, not only a device for an actuator but also a sensor device, a power generation device, or a combination thereof.

The present invention has been made in consideration of the above-described circumstances, and an object thereof is to provide a piezoelectric element having high stability which solves at least one of the above-described plural problems and operates with a high efficiency. In addition, another object of the present invention is to provide a method for manufacturing a piezoelectric element in which the above-described piezoelectric element can be manufactured through a simple process.

In order to achieve the above-described objects, the following aspects according to the present invention are provided.

According to a first aspect, there is provided a piezoelectric element comprising: a silicon substrate; a first electrode that is laminated on the silicon substrate; a first piezoelectric film that is laminated on the first electrode; a second electrode that is laminated on the first piezoelectric film; an adhesion layer that is laminated on the second electrode; an interlayer that is laminated on the adhesion layer, is formed of a material different from that of the second electrode, and has a thickness of 0.4 $\mu$m to 10 $\mu$m; a third electrode that is laminated on the interlayer; a second piezoelectric film that is laminated on the third electrode; and a fourth electrode that is laminated on the second piezoelectric film.

According to the first aspect, necessary rigidity can be secured with the structure in which the first piezoelectric film and the second piezoelectric film are laminated with the interlayer interposed therebetween. Since the interlayer is laminated using the adhesion layer, a laminate structure having strong adhesion can be obtained. In addition, by adopting the structure in which the first piezoelectric film and the second piezoelectric film are laminated, a piezoelectric element having higher efficiency than that of a single-layer unimorph structure of the related art can be obtained.

According to a second aspect, in the piezoelectric element according to the first aspect, in a bending mode of being bent in a film thickness direction, the interlayer may be used as a vibration plate and may operate using displacements of the first piezoelectric film and the second piezoelectric film in a piezoelectric constant d31 direction.

An operation of the piezoelectric element may be a driving operation using an inverse piezoelectric effect or may be a detecting operation using a positive piezoelectric effect.

According to a third aspect, in the piezoelectric element according to the second aspect, it is preferable that a stress neutral surface during the bending is present in the interlayer.

The stress neutral surface refers to a surface in which stress is 0, and is the center of stress. According to the third aspect, a balance of stress during an operation in the bending mode is not likely to deteriorate, and displacement characteristics are stable.

According to a fourth aspect, in the piezoelectric element according to any one of the first to third aspects, a material of the adhesion layer may be a transition metal element, a transition metal element oxide, or a combination of a transition metal element and a transition metal element oxide.

In particular, it is preferable that at least one element of Ti, Zr, Ni, Cr, W, Nb, and Mo is used.

According to fifth aspect, in the piezoelectric element according to any one of the first to fourth aspects, a material of the interlayer may contain silicon.

Silicon (Si) has a lower thermal expansion coefficient than the piezoelectric material, and a good balance between the interlayer and the silicon substrate is obtained. Therefore, according to the fifth aspect, the second piezoelectric film is easily formed.

According to a sixth aspect, in the piezoelectric element according to any one of the first to fifth aspects, it is preferable that each of the first piezoelectric film and the second piezoelectric film has a thickness of 0.3 $\mu$m to 10 $\mu$m.

According to the sixth aspect, sufficient device performance can be exhibited, and a piezoelectric element having high durability and reliability can be obtained.

According to a seventh aspect, in the piezoelectric element according to any one of the first to sixth aspects, the first piezoelectric film and the second piezoelectric film may have the same crystal orientation.

According to the seventh aspect, characteristics of the first piezoelectric film are similar to characteristics of the second piezoelectric film. Therefore, it is easy to design driving conditions. In addition, when the first and second piezoelectric films are driven, a balance is good, and a device having high reliability can be obtained.

According to an eighth aspect, in the piezoelectric element according to the seventh aspect, the first piezoelectric film and the second piezoelectric film may have a (100) orientation or a (001) orientation.

According to the eighth aspect, the piezoelectric element can be driven favorably in the bending mode.

According to a ninth aspect, in the piezoelectric element according to any one of the first to eighth aspects, a polarization direction of the first piezoelectric film and a polarization direction of the second piezoelectric film may be the same.

According to the ninth aspect, it is convenient to design a circuit for driving or detecting.

According to a tenth aspect, in the piezoelectric element according to any one of the first to ninth aspects, it is preferable that each of a residual stress of the first piezoelectric film and a residual stress of the second piezoelectric film is 200 MPa or lower in terms of an absolute value.

It is preferable that the absolute value of the residual stress is 200 MPa or lower from the viewpoint of suppressing peeling or cracking of the film. In particular, with the configuration in which the stress neutral surface, which is the center of stress calculated based on the thickness and stress values of each of the first piezoelectric film, the second piezoelectric film, and the interlayer, is present in the interlayer, the piezoelectric element can be efficiently used for driving or sensing.

According to an eleventh aspect, in the piezoelectric element according to any one of the first to tenth aspects, it is preferable that a thermal expansion coefficient of the interlayer is two times or less than thermal expansion coefficients of the first piezoelectric film and the second piezoelectric film.

According to the eleventh aspect, cracking or peeling caused by a difference in thermal expansion coefficient can be prevented.

According to a twelfth aspect, in the piezoelectric element according to any one of the first to eleventh aspects, it is preferable that a thickness of the second piezoelectric film is 0.5 times to 2 times a thickness of the first piezoelectric film.

According to the twelfth aspect, a balance of stress between the first piezoelectric film and the second piezoelectric film between which the interlayer is interposed is good. Therefore, initial warping caused by residual stress can be suppressed.

According to a thirteenth aspect, in the piezoelectric element according to any one of the first to twelfth aspects, it is preferable that each of the first electrode, the first piezoelectric film, the second electrode, the interlayer, the adhesion layer, the third electrode, the second piezoelectric film, and the fourth electrode is formed using a thin film formation method.

According to the thirteenth aspect, a film having high adhesion and high film thickness uniformity can be formed, and a piezoelectric element having a small variation in performance can be obtained.

According to a fourteenth aspect, in the piezoelectric element according to the thirteenth aspect, the thin film formation method may be a vapor phase epitaxial method.

By using a vapor phase epitaxial method, a piezoelectric element having high film thickness uniformity can be obtained at a relatively low cost.

According to a fifteenth aspect, there is provided a method for manufacturing a piezoelectric element, the method comprising: a first electrode formation step of forming a first electrode on a silicon substrate; a first piezoelectric film formation step of forming a first piezoelectric film on the first electrode; a second electrode formation step of forming a second electrode on the first piezoelectric film; an adhesion layer formation step of forming an adhesion layer on the second electrode; an interlayer formation step of forming an interlayer on the adhesion layer the interlayer being formed of a material different from that of the second electrode and having a thickness of 0.4 µm to 10 µm; a third electrode formation step of forming a third electrode on the interlayer; a second piezoelectric film formation step of forming a second piezoelectric film on the third electrode; a fourth electrode formation step of forming a fourth electrode on the second piezoelectric film; and a removal step of removing a part of the silicon substrate by etching, in which each of the first electrode, the first piezoelectric film, the second electrode, the interlayer, the adhesion layer, the third electrode, the second piezoelectric film, and the fourth electrode is formed using a thin film formation method.

According to the fifteenth aspect, a piezoelectric element which operates with high efficiency can be manufactured through a simple process. In the method for manufacturing a piezoelectric element according to the fifteenth aspect, features specified in the second to fourteenth aspects can be appropriately combined with each other.

According to the present invention, a piezoelectric element having high stability which operates with high efficiency can be provided. In addition, with the method for manufacturing a piezoelectric element according to the present invention, a piezoelectric element having high stability which operates with high efficiency can be manufactured through a simple process.

BRIEF DESCRIPTION OF THE DRAWINGS

FIG. 9 is a table collectively showing the results of the evaluation experiment of a device.

FIG. 10 is a table collectively showing the results of the evaluation experiment of a device.

DESCRIPTION OF THE PREFERRED EMBODIMENTS

Hereinafter, an embodiment of the present invention will be described in detail with reference to the accompanying drawings.

Figure 1:
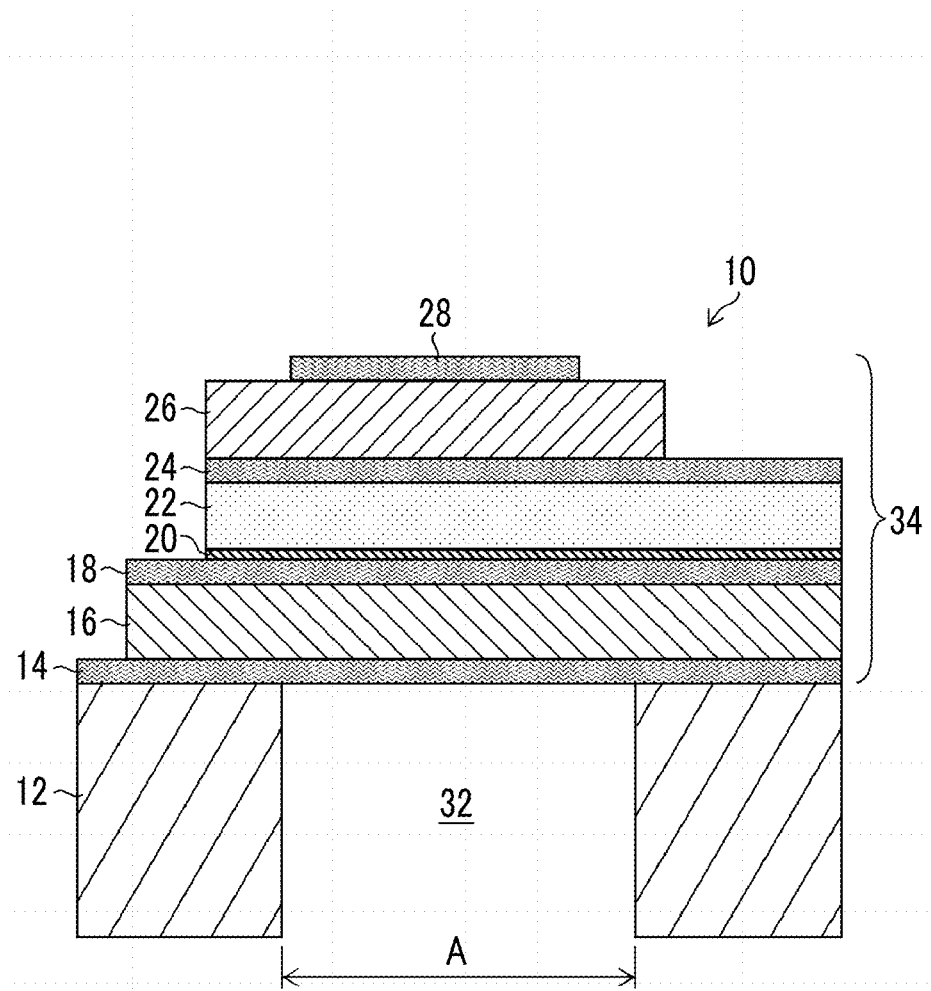
FIG. 1 is a cross-sectional view showing a configuration example of a piezoelectric element according to an embodiment of the present invention.

FIG. 1 is a cross-sectional view showing a configuration example of a piezoelectric element according to an embodiment of the present invention. An piezoelectric element 10 according to the embodiment is a micro electro mechanical system (MEMS) device having a laminate structure in which a first electrode 14 is laminated on a silicon (Si) substrate 12 and in which a first piezoelectric film 16, a second electrode 18, an adhesion layer 20, an interlayer 22, a third electrode 24, a second piezoelectric film 26, and a fourth electrode 28 are laminated in this order on the first electrode 14. The interlayer 22 is formed of a material different from that of the second electrode 18 and functions as a vibration plate. The interlayer 22 has a thickness of 0.4 µm to 10 µm.

In addition, a portion of the silicon substrate 12 is removed, and the removed portion forms a concave portion 32.

The piezoelectric element 10 has a diaphragm structure in which a laminate 34 functions as a movable portion which is bendable in a film thickness direction (vertical direction of FIG. 1) at a position corresponding to an open region A of the concave portion 32 of the silicon substrate 12, the laminate 34 including the first electrode 14, the first piezoelectric film 16, the second electrode 18, the adhesion layer 20, the interlayer 22, the third electrode 24, the second piezoelectric film 26, and the fourth electrode 28.

The silicon substrate 12 functions as a support that supports the laminate 34 including the first electrode 14, the first piezoelectric film 16, the second electrode 18, the adhesion layer 20, the interlayer 22, the third electrode 24, the second piezoelectric film 26, and the fourth electrode 28. That is, the silicon substrate 12 functions as a fixing portion that fixes an edge of the movable portion corresponding to the open region A of the concave portion 32. In the piezoelectric element 10, in a bending mode of being bent in a film thickness direction, the interlayer 22 is used as a vibration plate and operates using displacements of the first piezoelectric film 16 and the second piezoelectric film 26 in a piezoelectric constant d31 direction.

The thickness and proportion of each layer shown in FIG. 1 and other drawings are appropriately changed for convenience of description and do not necessarily reflect the actual thickness and proportion thereof. In addition, in this specification, in the description for the laminate structure, a direction away from a surface of the silicon substrate 12 to a substrate thickness direction will be described as "upward". In FIG. 1, in a state where the silicon substrate 12 is horizontally kept, the first electrode 14 and the other layers (14 to 28) are laminated in this order on an upper surface of the silicon substrate 12. Therefore, a vertical relationship in FIG. 1 matches with a vertical relationship when a gravity direction (downward in FIG. 1) is set as a downward direction. However, the posture of the silicon substrate 12 may be inclined or reversed. Even in a case where a lamination direction of the laminate structure which depends on the posture of the silicon substrate 12 does not match with a vertical direction with respect to the gravitation direction, a direction away from the surface of the silicon substrate 12 in the thickness direction will be described as "upward" in order to describe a vertical relationship of the laminate structure without confusion. For example, even in a case where the upward and downward directions in FIG. 1 are reversed, it will be described that the first electrode 14 is formed on the silicon substrate 12 and that the first piezoelectric film 16 is laminated on the first electrode 14. In addition, the expression "B is laminated on A" may imply not only a case where B is directly laminated on A in contact with A but also a case where B is laminated on A with one layer or plural layers interposed between A and B.

Figure 2:
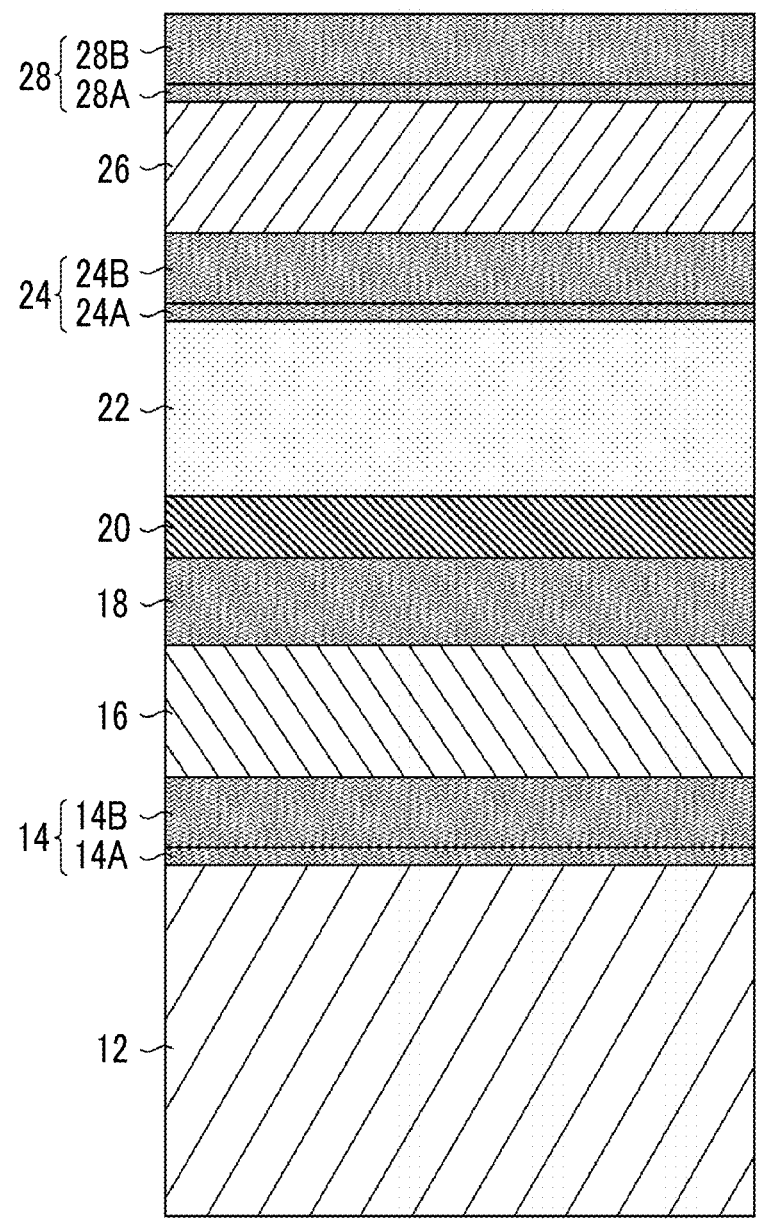
FIG. 2 is a schematic diagram showing a laminate structure of the piezoelectric element according to the embodiment.

FIG. 2 is a schematic diagram showing the laminate structure of the piezoelectric element 10. As the silicon substrate 12 which is the bottom layer, a silicon wafer (a non-SOI substrate not having a SOI structure) as a standard commercially available product is used.

Each of the layers (14 to 28) is formed on the silicon substrate 12 using a thin film formation method. Examples of the thin film formation method include a physical vapor deposition (PVD) method, a chemical vapor deposition (CVD) method, a liquid phase film formation method (for example, plating, coating, a sol-gel method, or a spin coating method), and a thermal oxidation method. An appropriate film formation method can be selected for each layer, but it is most preferable that all the layers are formed using a vapor phase epitaxial method. Using the vapor phase epitaxial method, the thickness can be controlled with high accuracy. In addition, a material is inexpensive, a film formation rate is high, and mass productivity is high. Therefore, the costs of a device can be reduced.

The first electrode 14 according to this example has a configuration in which, using a vapor phase epitaxial method represented by a sputtering method, a Ti layer 14A is formed in contact with the silicon substrate 12, and an Ir layer 14B is formed on the Ti layer 14A. As a material constituting the first electrode 14, in addition to the above-described examples, a material such as platinum (Pt), aluminum (Al), molybdenum (Mo), titanium nitride (TiN), ruthenium (Ru), gold (Au), or silver (Ag) can be used. In addition, in order to improve adhesion with the silicon substrate 12, the adhesion layer may be formed of TiW instead of Ti.

The thickness of the first electrode 14 can be designed to be an appropriate thickness but is preferably in a range of substantially several tens of nanometers to several hundreds of nanometers. For example, the thickness of the first electrode 14 is in a range of 50 nm to 300 nm.

The first piezoelectric film 16 is formed with a method for increasing the substrate temperature (to preferably 400° C. or higher) to cause crystallization during the film formation using a vapor phase epitaxial method represented by a sputtering method. In the case of an oxide piezoelectric body, a material is not particularly limited. The thickness of the first piezoelectric film 16 is preferably 0.3 μm to 10 μm. When the thickness of the first piezoelectric film 16 is less than 0.3 μm, sufficient driving power for an actuator cannot be exhibited. In addition, there is a concern that it is difficult to extract a sufficient voltage signal for a sensor or a power generation device. In addition, when the first piezoelectric film 16 is excessively thin, the first piezoelectric film 16 may be broken by a leakage current. Further, when the first piezoelectric film 16 is excessively thin, the crystallinity of the piezoelectric body deteriorates, and there may be a problem that necessary piezoelectric performance cannot be obtained. On the other hand, when the thickness of the first piezoelectric film 16 is more than 10 μm, cracking or peeling is likely to occur. Therefore, it is difficult to form the first piezoelectric film 16 using a vapor phase epitaxial method.

Accordingly, the thickness of the first piezoelectric film 16 is preferably 0.3 μm to 10 μm, more preferably 0.5 μm to 8 μm, and still more preferably 1 μm to 7 μm.

As a material of the second electrode 18, for example, an Ir oxide is used. In this specification, an Ir oxide is represented by "IrOx". x represents an arbitrary number representing a composition ratio. The material of the second electrode 18 is not limited to IrOx, and other conductive materials can be used. When a metal oxide is used as the material of the second electrode 18, the second electrode 18 functions as a diffusion blocking layer which blocks a diffusion reaction of an oxygen atom or a piezoelectric material component from the first piezoelectric film 16.

The adhesion layer 20 is laminated on the second electrode 18. As a material of the adhesion layer 20, a transition metal element, a transition metal element oxide, or a combination thereof is preferable. In particular, Ti, Zr, Ni, Cr, W, Nb, Mo, or an oxide thereof is preferable. In this example, the adhesion layer 20 is formed of Ti.

Next to the adhesion layer 20, a silicon (Si) layer as the interlayer 22 is laminated. It is preferable that the interlayer 22 is formed of a material containing silicon (Si) as a major component. "Containing as a major component" represents that a material is contained in an amount of 50 mass % or higher. Si has a lower thermal expansion coefficient than the piezoelectric material, and the substrate as the bottom layer (as the underlayer) is the silicon substrate 12. Therefore, when the interlayer 22 is formed of a material containing Si as a major component, the film thickness can be easily made thin. That is, by forming the interlayer 22 formed of Si after the formation of the first piezoelectric film 16, a good balance with the underlying Si can be obtained. Therefore, the second piezoelectric film 26 can be easily formed.

In a case where the interlayer 22 is directly formed on the second electrode 18 without providing the adhesion layer 20, peeling is likely to occur during the formation of the interlayer 22 or the second piezoelectric film 26. Therefore, even in a case where peeling does not occur in a standstill state, for example, long-term driving causes peeling, and thus durability deteriorates. Therefore, it is preferable that the interlayer 22 is formed on the second electrode 18 with the adhesion layer 20 interposed therebetween. Regarding each of the adhesion layer 20 and the interlayer 22, electrical characteristics thereof are not particularly limited.

It is preferable that the interlayer 22 is formed using a vapor phase epitaxial method. By forming the interlayer 22 using a vapor phase epitaxial method, the piezoelectric element 10 having high adhesion and high film thickness uniformity can be continuously manufactured.

The interlayer 22 may be formed using a method other than a vapor phase epitaxial method. However, for example, when a method for bonding and polishing a material is adopted, the thickness accuracy of polishing is insufficient as compared to the thickness accuracy of the vapor phase epitaxial method, which causes a variation in element performance (characteristics). In addition, when a method such as a sol-gel method or a screen plating method is adopted, a heat treatment (firing treatment) at a high temperature is necessary to fire the interlayer, which causes cracking of the piezoelectric films or causes stress due to a difference in thermal expansion coefficient. Accordingly, during the formation of the interlayer 22, it is preferable that a vapor phase epitaxial method is adopted from the viewpoint of avoiding the above-described concern.

As in the case of the first electrode 14, the third electrode 24 formed on the interlayer 22 has a configuration of a laminated film in which a Ti layer 24A and an Ir layer 24B are laminated. As a material constituting the third electrode 24, the same material as that of the first electrode 14 can be used. The first electrode 14 and the third electrode 24 may be formed of the same material or different materials.

As in the case of the first piezoelectric film 16, the second piezoelectric film 26 is formed with a method for increasing the substrate temperature (to preferably 400° C. or higher) to cause crystallization during the film formation using a vapor phase epitaxial method. As in the case of the first piezoelectric film 16, the thickness of the second piezoelectric film 26 is preferably 0.3 µm to 10 µm, more preferably 0.5 µm to 8 µm, and still more preferably 1 µm to 7 µm. The first piezoelectric film 16 and the second piezoelectric film 26 may have the same thickness or different thicknesses. In addition, as a material of the second piezoelectric film 26, the same material as that of the first piezoelectric film 16 is preferably used, but a material different from that of the first piezoelectric film 16 may be used.

As a material of the fourth electrode 28 formed on the second piezoelectric film 26, various materials can be used as in the case of the first electrode 14. The fourth electrode 28 according to this example has a configuration in which a Pt layer 28B is laminated on a Ti layer 28A. In addition, a TiW layer may be used instead of the Ti layer 28A.

<Specific Example of Manufacturing Method>

FIGS. 3A to 4C are diagrams showing a manufacturing process of a piezoelectric element of an example according to the embodiment.

[Step 1]

Figure 3A:
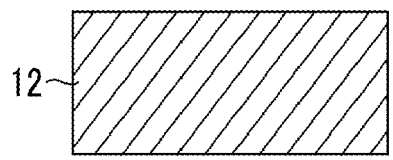
FIGS. 3A to 3F are diagrams showing a manufacturing process of the piezoelectric element.

First, a substrate which forms the silicon (Si) substrate 12 is prepared ("substrate preparation step" corresponding to FIG. 3A). Here, a silicon wafer having a non-SOI structure is used as an example. A $SiO_2$ film (oxide film) may be formed on a surface of the silicon wafer.

[Step 2]

Figure 3B:
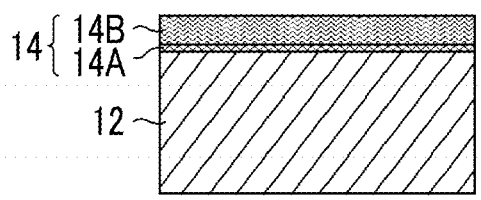

Next, as shown in FIG. 3B, the first electrode 14 is formed on a single surface (upper surface in FIG. 3B) of the silicon substrate 12 (first electrode formation step). In this example, in order to form the first electrode 14, using a sputtering method, the Ti layer 14A having a thickness of 20 nm is formed, and the Ir layer 14B having a thickness of 150 nm is formed on the Ti layer 14A. During the formation, the substrate temperature is set as 350° C. The first electrode 14 which is a laminated film of Ir (150 nm)/Ti (20 nm) functions as "first lower electrode".

[Step 3]

Figure 3C:
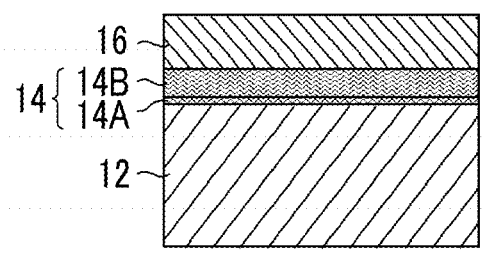

Next, as shown in FIG. 3C, the first piezoelectric film 16 is formed on the first electrode 14 ("first piezoelectric film formation step"). In this example, the substrate temperature is set to about 500° C. (for example, 480° C.), and a PZT film having a thickness of 2.5 µm which is doped with 13% (atomic composition ratio) of Nb is formed using a sputtering method. For convenience of description, Nb-doped PZT (PNZT) will be referred to simply as "PZT". In order to form the first piezoelectric film 16, a high-frequency (radio frequency; RF) magnetron sputtering device is used. As film formation gas, mixed gas containing 97.5% of Ar and 2.5% of $O_2$ is used. As a target material, a material having a composition of $Pb_{1.3}((Zr_{0.52}Ti_{0.48})_{0.88}Nb_{0.12})O_3$ is used. The film formation pressure is set to 2.2 mTorr (0.293 Pa).

[Step 4]

Figure 3D:
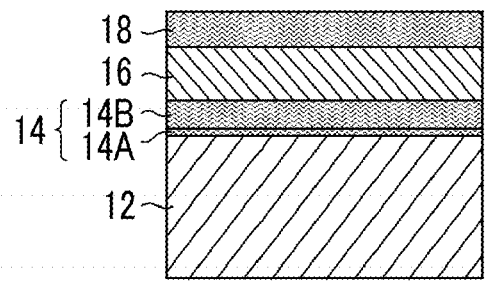

Next, as shown in FIG. 3D, the second electrode 18 is formed on the first piezoelectric film 16 ("second electrode formation step"). As the second electrode 18, any one of an oxide electrode and a non-oxide electrode may be used. However, from the viewpoints of adhesion and durability, an oxide electrode is preferable. In particular, it is preferable that the second electrode 18 is stable to the film formation temperature of the second piezoelectric film 26. As an oxide electrode, for example, ITO or IrOx is preferable. In this example, an IrOx film having a thickness of 200 nm is formed on the first piezoelectric film 16 using a sputtering method at a film formation temperature of 350° C. The second electrode 18 which is the IrOx film (200 nm) functions as "first upper electrode".

[Step 5]

Figure 3E:
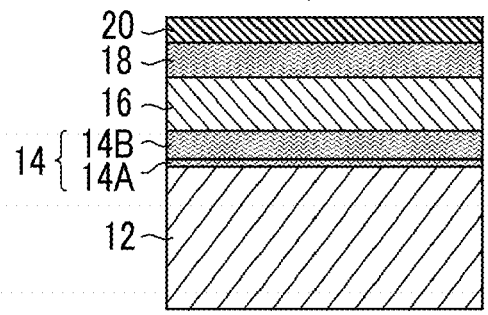

Next, as shown in FIG. 3E, the adhesion layer 20 is formed on the second electrode 18 ("adhesion layer formation step"). In this example, in order to improve the adhesion with the Si film which is the interlayer 22, a Ti layer having a thickness of 20 nm is formed as the adhesion layer 20.

[Step 6]

Figure 3F:
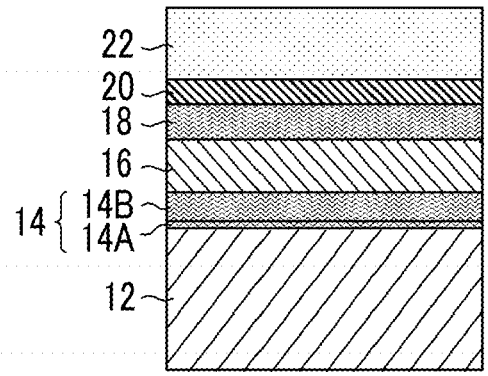

Next, as shown in FIG. 3F, the interlayer 22 functioning as a vibration plate is formed on the adhesion layer 20 ("interlayer formation step"). In this example, a silicon film having a thickness of 3 µm is formed as the interlayer 22 using a sputtering method. The film formation method is not limited to a sputtering method and may be CVD or laser ablation.

It is preferable that the Si film constituting the interlayer 22 is a columnar structure. The columnar structure is efficiently displaced in response to a displacement in the bending mode of being bent in the film thickness direction. By forming the interlayer 22 using a vapor phase epitaxial method, a thin film having a columnar structure can be formed.

In addition, it is preferable that the interlayer 22 contains an amorphous component. When an amorphous component is present in the Si film, there is an advantageous effect of strong resistance to impact such as cracking. Further, regarding the film thickness uniformity of the interlayer 22, it is preferable that a variation in the in-plane thickness of, for example, a 6-inch wafer is 10% or lower. It is preferable that the film thickness is uniform from the viewpoint of reducing a variation in device performance According to the film thickness accuracy of the vapor phase epitaxial method, desired uniformity can be secured.

When a method for bonding a material through an adhesive or a method for adjusting the thickness by polishing is used during the preparation of the laminate structure, it is difficult to achieve desired thickness uniformity in many cases. On the other hand, when a direct film formation method such as a vapor phase epitaxial method or a sol-gel method is used, a thin film can be formed with high thickness accuracy satisfying desired film thickness uniformity.

The thickness of the interlayer 22 is preferably 0.4 μm to 10 μm. The reason for this is as follows. Since the center of stress (stress neutral surface) generated during the displacement in the bending mode is positioned in the interlayer 22 which is a non-driven portion, the efficiency of the displacement is improved.

[Step 7]

Figure 4A:
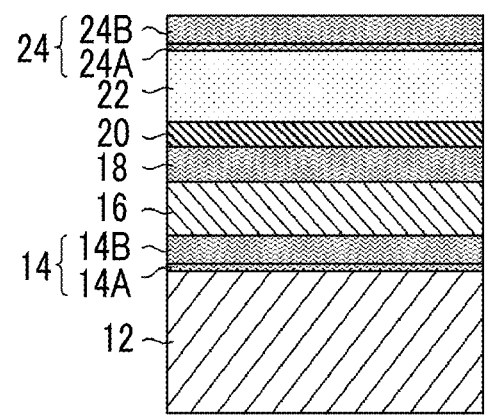
FIGS. 4A to 4C are diagrams showing the manufacturing process of the piezoelectric element.

Next, as shown in FIG. 4A, the third electrode 24 is formed on the Si film which is the interlayer 22 ("third electrode formation step"). In this example, as in the case of the first electrode 14, using a sputtering method, the Ti layer 24A having a thickness of 20 nm is formed, and the Ir layer 24B having a thickness of 150 nm is formed on the Ti layer 24A. During the formation, the substrate temperature is set as 350° C. The third electrode 24 which is a laminated film of Ir (150 nm)/Ti (20 nm) functions as "second lower electrode".

[Step 8]

Figure 4B:
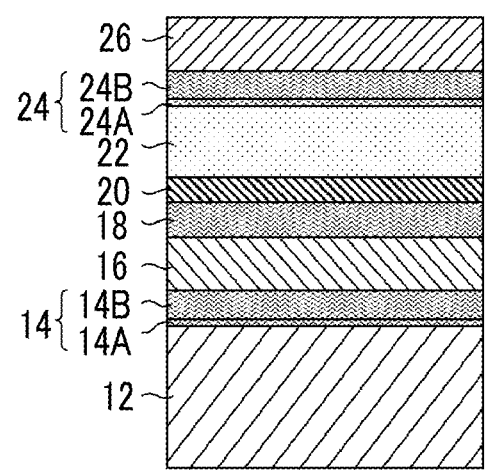

Next, as shown in FIG. 4B, the second piezoelectric film 26 is formed on the third electrode 24 ("second piezoelectric film formation step"). In this example, as in the case of the formation of the first piezoelectric film 16, the substrate temperature is set to about 500° C. (for example, 480° C.), and a PZT film having a thickness of 3.0 μm which is doped with 13% (atomic composition ratio) of Nb is formed using a sputtering method. Film formation conditions are the same as those of the first piezoelectric film 16.

Figure 5:
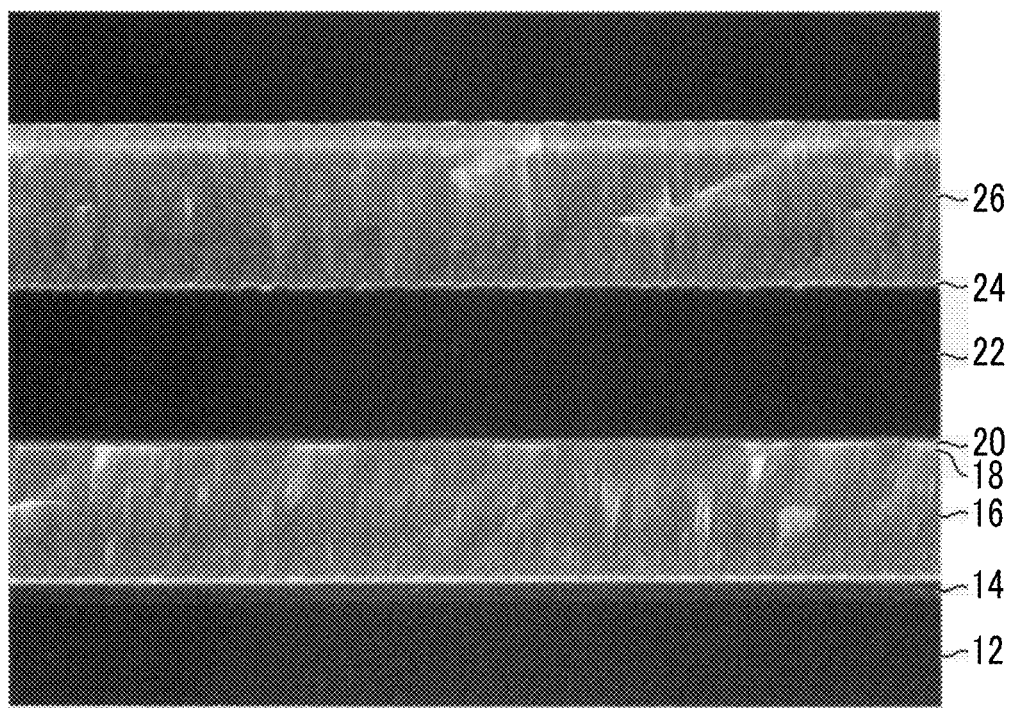
FIG. 5 is a scanning electron microscope image showing a configuration of a laminate prepared as an example according to the embodiment.

For reference, FIG. 5 is a scanning electron microscope (SEM) image showing a cross-section of a film configuration of the laminate in a state where the second piezoelectric film 26 is formed through Step 8. Through Steps 1 to 8, a laminate having a configuration shown in FIG. 5 is obtained. As shown in FIG. 5, according to the example of the embodiment, the first piezoelectric film 16 and the second piezoelectric film 26 are laminated with strong adhesion with the interlayer 22 interposed therebetween, and a satisfactory laminate structure having no peeling can be obtained.

[Step 9]

Figure 4C:
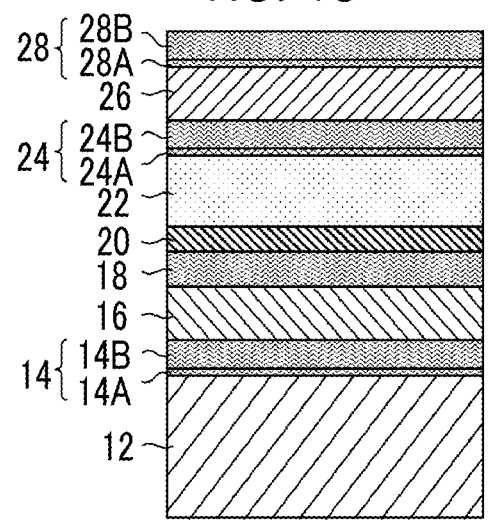

Next, as shown in FIG. 4C, the fourth electrode 28 is formed on the second piezoelectric film 26 ("fourth electrode formation step"). In this example, using a sputtering method, the Ti layer 28A having a thickness of 20 nm is formed, and the Pt layer 28B having a thickness of 150 nm is formed on the Ti layer 28A. During the formation, the substrate temperature is set to room temperature. The fourth electrode 28 which is a laminated film of Pt (150 nm)/Ti (20 nm) functions as "second upper electrode". The fourth electrode 28 may be patterned in combination with a lift-off method.

Further, a third piezoelectric film may be laminated on the fourth electrode 28. If a step of laminating the third piezoelectric film on the fourth electrode 28 is not provided, the fourth electrode 28 can be formed at room temperature. Further, as the fourth electrode 28, any one of an oxide electrode and a non-oxide electrode may be used.

[Step 10]

The laminate structure obtained as described above is patterned in a desired device shape through dry etching ("device patterning step").

[Step 11]

Next, a part of the silicon substrate 12 is removed by deep-drilling Si from a back surface side of the silicon substrate 12, and a diaphragm structure (refer to FIG. 1) is formed ("removal step").

The Si deep-drilling technique is a microfabrication technique using reactive ion etching (RIE) and is called deep RIE.

During the etching of the back surface of the silicon substrate 12, a stop layer for stopping etching may be provided in the silicon substrate 12 in advance. For example, a $SiO_2$ film may be formed on a surface of a silicon wafer as a substrate, and this $SiO_2$ film may be used as a stop layer for stopping etching. Etching may be dry etching or wet etching. A well-known etching technique may be applied.

In addition, instead of removing a part of the silicon substrate 12 to form a diaphragm structure, a part of the silicon substrate 12 may be removed to form a cantilever structure.

By patterning the silicon substrate 12 into a device shape or performing the removal step of the silicon substrate 12 after preparing the thin laminate structure using the above-described manufacturing method, cracking or destruction is not likely to occur in the device.

After forming the layers through the above-described respective steps, the pressure and temperature may be returned to the atmospheric pressure and room temperature, or film formation may be continuously performed. In addition, optionally, a patterning step may be performed. Film formation using a material other than PZT may be performed at room temperature. However, from the viewpoint of durability, it is preferable that the material other than PZT to form a film because stress applied to PZT can be reduced.

<Orientation of Piezoelectric Films>

Figure 6:
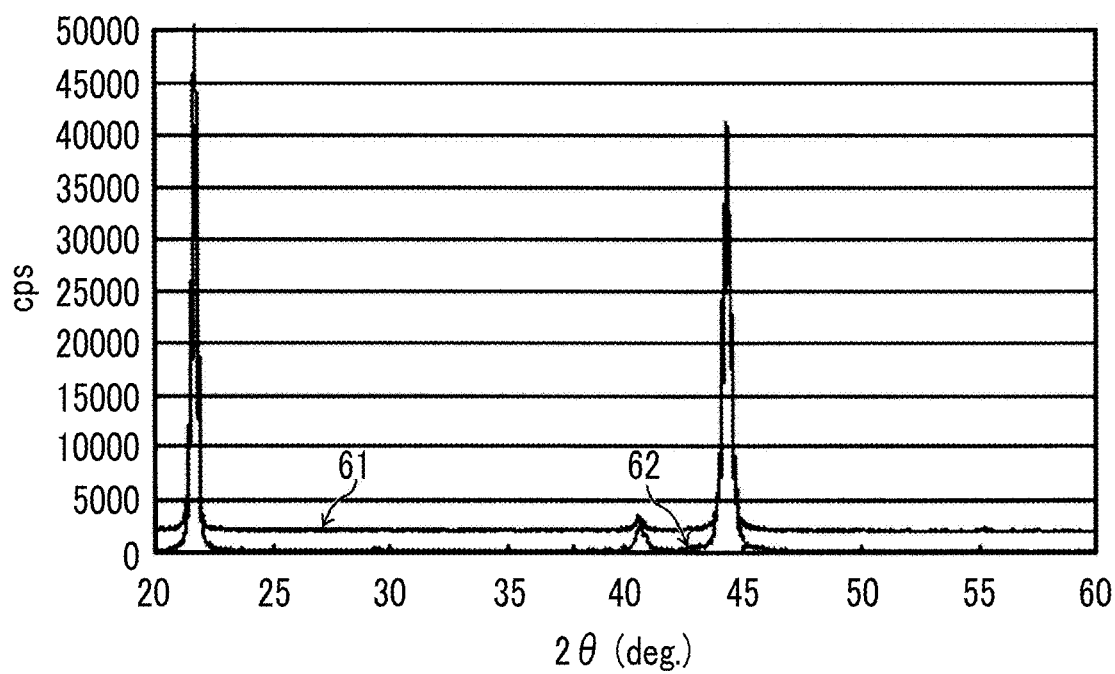
FIG. 6 is a graph showing the results of X-ray diffraction analysis of the laminate (FIG. 5) prepared as the example according to the embodiment.

FIG. 6 shows the results of X-ray diffraction (XRD) analysis of the laminate (FIG. 5), which includes the two piezoelectric films, prepared as the example according to the embodiment. In FIG. 6, the horizontal axis represents a reflection angle 2θ, and the vertical axis represents a diffraction intensity. The unit of the diffraction intensity of the vertical axis is cps (count per second). In FIG. 6, reference numeral 61 represents the XRD measurement result of the first piezoelectric film 16 (refer to FIG. 1) which is the first layer, and reference numeral 62 in FIG. 6 represents the XRD measurement result of the second piezoelectric film 26 (refer to FIG. 2) which is the second layer. As shown in FIG. 6, regarding the crystal orientation distribution, the first piezoelectric film 16 prepared in this example has a (100) orientation or a (001) orientation, and the second piezoelectric film 26 formed and laminated on the first piezoelectric film also has a (100) orientation or a (001) orientation. That is, the first piezoelectric film 16 and the second piezoelectric film 26 are highly oriented piezoelectric films having crystal orientation.

It is known that the piezoelectric performance of a piezoelectric body in a bending mode, that is, a piezoelectric constant $d_{31}$ (pm/V) thereof varies depending on the crystal orientation of the piezoelectric body. When piezoelectric films have the same orientation, these piezoelectric films can be handled under the same driving conditions, and a shift of a stress neutral surface can be suppressed. Therefore, it is preferable that the first piezoelectric film 16 and the second piezoelectric film 26 have the same crystal orientation.

If two piezoelectric films have different orientations, or if one piezoelectric film has a (100) orientation and the other piezoelectric film has a (111) orientation, driving conditions of the piezoelectric films are significantly different from each other, and thus a driving design is complicated.

On the other hand, in this example, the two piezoelectric films (16, 26) can be made to have the same orientation. As a result, a driving design is simple, and the piezoelectric films can be driven favorably. In addition, by making the two piezoelectric films (16, 26) to have the same orientation, the amount of strains generated during long-term driving is small, and a device having high reliability can be realized. In FIG. 6, the two piezoelectric films shows a (100) orientation but may have a (001) orientation.

Residual stress values of the piezoelectric films (16, 26) prepared in the example of the embodiment are about "+150 MPa" in terms of tensile stress when measured based on the results of measuring the amount of warpage. Using another sample, a piezoelectric film is formed under different film formation conditions. When the stress value is higher than "+200 MPa", cracking and peeling occur in the piezoelectric film during the film formation process. Based on the above experimental finding, it is preferable that stress of each of the piezoelectric films (16, 26) is 200 MPa or lower in terms of an absolute value.

<Regarding Center of Stress>

It is preferable that the center of stress (stress neutral surface) generated during driving in the bending mode is present in the interlayer 22 (refer to FIG. 1). If the center of stress is shifted from the interlayer 22 and is present in the first piezoelectric film 16 or the second piezoelectric film 26, a balance of stress generated during driving significantly deteriorates, and there is a concern that displacement characteristics may significantly change.

In a case where the thickness of the interlayer is excessively small, when there is a difference between the thicknesses of the upper and lower piezoelectric films, the stress neutral surface is shifted from the interlayer and is present in one of the piezoelectric films. In addition, in a case where a higher voltage is applied during piezoelectric driving, different voltage values may be applied to the upper and lower piezoelectric films so as not to be higher than a coercive electric field of the piezoelectric material. In this case, the stress neutral surface is shifted from the center of the interlayer to a larger degree as compared to a case where the same voltage value is applied to the upper and lower piezoelectric films. Therefore, it is preferable that the thickness of the interlayer 22 has an appropriate thickness such that the stress neutral surface is present in the interlayer 22. It is preferable that the thickness of the interlayer 22 is at least 0.3 µm. It is more preferable that the thickness of the interlayer 22 is 2.0 µm or more. The upper limit of the thickness of the interlayer 22 is not particularly limited. However, it is considered that a range where the interlayer 22 can be favorably formed using a direct film formation method such as a vapor phase epitaxial method is limited to about 10 µm. In this example, the thickness of the interlayer 22 is 3 µm.

<Regarding Thermal Expansion Coefficient of Interlayer>

The thermal expansion coefficient of the piezoelectric material is about 6 ppm/° C. to 8 ppm/° C., and the thermal expansion coefficient of silicon is about 2.4 ppm/° C. According to the embodiment, in a heating or usage environment, the center of a stress change generated by a difference in thermal expansion coefficient between the piezoelectric material and the interlayer 22 is present in the interlayer 22.

When a material having an extremely higher thermal expansion coefficient than the piezoelectric material is used as a material of the interlayer 22, high thermal stress is generated by a difference between the film formation temperature (400° C. or higher) and room temperature, which may cause cracking or peeling. Accordingly, from the viewpoint of avoiding the above-described problem, the thermal expansion coefficient of the interlayer 22 is preferably equal to or lower than a thermal expansion coefficient, which is two times that of the piezoelectric material, and is more preferably lower than that of the piezoelectric material.

In this example, silicon (Si) having a lower thermal expansion coefficient than the piezoelectric material (PZT) is used as a material of the interlayer 22.

<Regarding Polarization Direction of Piezoelectric Films.

Regarding the piezoelectric element 10 according to this example, the polarization directions of the first piezoelectric film 16 and the second piezoelectric film 26 are investigated. The polarization direction of the first piezoelectric film 16 is a direction away from the first electrode 14 to the second electrode 18, and the polarization direction of the second piezoelectric film 26 is a direction away from the third electrode 24 to the fourth electrode 28. In order to favorably drive this device, the polarization directions are set as follows. When the first electrode 14 is set as a ground potential, the polarization direction of the first piezoelectric film 16 is set such that a negative potential is applied to the second electrode 18. When the third electrode is set as a ground potential, the polarization direction of the second piezoelectric film 26 is set such that a negative potential is applied to the fourth electrode.

When an electric field acts in same direction as the polarization direction of one of the piezoelectric films, the piezoelectric film contracts in a plane direction due to a piezoelectric transverse effect (d31 mode). When the piezoelectric film laminated on the interlayer 22 contracts in the plane direction, the interlayer 22 functioning as a vibration plate restricts the deformation of the piezoelectric film. Therefore, the vibration plate is bent in the thickness direction.

As a drive voltage which causes an electric field to act on the piezoelectric film, a positive potential or a negative potential may be selected. Regarding a driving direction, in FIG. 1, whether the vibration plate is bent in a direction so as to be upwardly convex or downwardly convex can be determined based on a relationship between the polarization direction of the piezoelectric body and the vibration plate which is the interlayer 22.

Further, a phase of a voltage applied to the first piezoelectric film 16 and a phase of a voltage applied to the second piezoelectric film 26 may change. A driving method can be freely selected according to the use/purpose of the device. For example, in a case where the first piezoelectric film 16 and the second piezoelectric film 26 are driven after shifting phases thereof, a displacement, which is effectively about two times a displacement in a case where only one of the piezoelectric films is driven, can be realized. In addition, a part of the electrodes can be used for sensing. For example, in the piezoelectric element 10 shown in FIG. 1, the first piezoelectric film 16 can be used for detecting (sensing), and the second piezoelectric film 26 can be used as for driving (actuator). That is, a first element portion having a configuration in which the first piezoelectric film 16 is interposed between the first electrode 14 and the second electrode 18 functions as a sensor portion which converts a displacement of the first piezoelectric film 16 into an electric signal using a positive piezoelectric effect. In addition, a second element portion having a configuration in which the second piezoelectric film 26 is interposed between the third electrode 24 and the fourth electrode 28 functions as a driver portion which converts a drive voltage into a displacement of the second piezoelectric film 26 using an inverse piezoelectric effect.

According to the above-described configuration, a voltage generated by strains when the second piezoelectric film 26 is driven can be sensed by the first piezoelectric film 16. By acquiring correlation data indicating a correlation between the voltage detected by the first piezoelectric film 16 and the displacement in advance, the displacement can be determined from the detected voltage information with reference to correlation data.

In a configuration of a unimorph actuator of the related art, it is necessary that separately arrange a piezoelectric portion which functions as a sensor portion and a piezoelectric portion which functions as a driver portion in a plane. In this device structure of the related art, it is necessary that the limited device area is divided into a portion functioning as a sensor portion and a portion functioning as a driver portion to secure regions for the two portions. Therefore, due to the limited area, it is necessary to sacrifice the efficiency of one of the two portions to some extent.

On the other hand, according to the structure of the embodiment, a driving electrode used as a driver portion and a detecting electrode used as a sensor portion can be appropriately arranged.

The piezoelectric element 10 according to the embodiment is not limited to the configuration of being used as an actuator or a sensor and may be used as a power generation device which converts a displacement of the piezoelectric film into electrical energy.

<Regarding Evaluation of Device>

Figure 7:
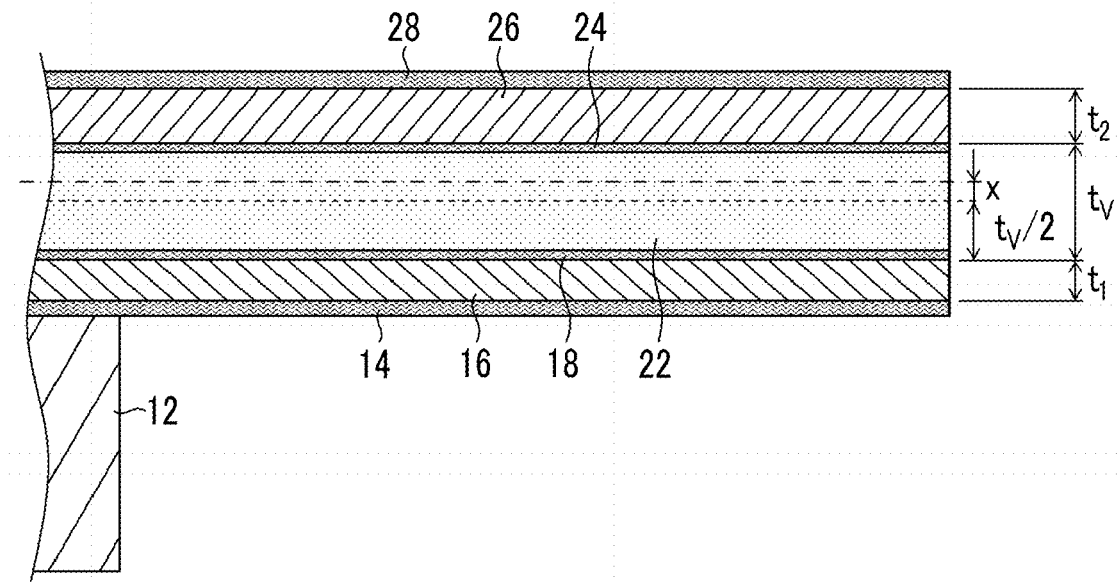
FIG. 7 is a cross-sectional view schematically showing a device structure which was used in an evaluation experiment of a device.

Samples of the piezoelectric element according to the embodiment were actually prepared, and the performance of each sample was evaluated. FIG. 7 is a cross-sectional view schematically showing a cantilever structure which was used in an evaluation experiment. FIG. 7 schematically shows a laminate structure, but an actual laminate structure is as shown in FIG. 2. In FIG. 7, the same components as those shown in FIG. 2 are represented by the same reference numerals.

In the cantilever structure shown in FIG. 7, a left end portion supported by the silicon substrate 12 functions as a fixing portion. Devices having various dimensions were prepared, in which $t_1$ represents the thickness of the first piezoelectric film 16, $t_2$ represents the thickness of the second piezoelectric film 26, and $t_v$ represents the thickness of a portion interposed therebetween, that is, the total thickness of the interlayer 22, the second electrode 18, and the third electrode 24. The thicknesses of the second electrode 18 and the third electrode 24 can be sufficiently reduced relative to the thickness of the interlayer 22. Therefore, $t_v$ can be substantially considered as the thickness of the interlayer 22. Hereinafter, for convenience of description, it will be considered that $t_v$ represents the thickness of the interlayer 22 functioning as a vibration plate.

Figure 8:
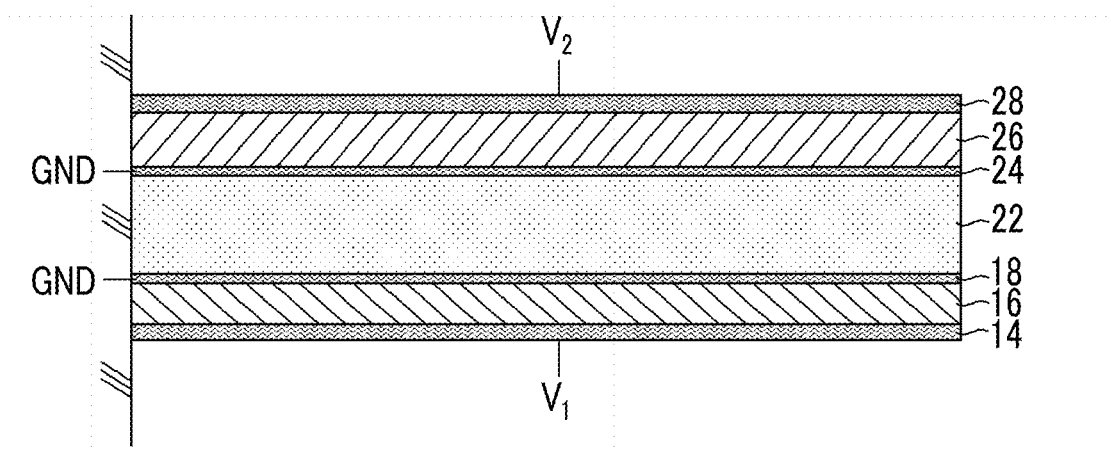
FIG. 8 is a diagram showing an example of a method for applying a drive voltage.

In each of the prepared devices, a static displacement obtained when a drive voltage was applied and a variation in a displacement obtained when a sine wave drive voltage was continuously applied were evaluated. In a method for applying a drive voltage, as shown in FIG. 8, the second electrode 18 and the third electrode 24 were set as ground potentials (GND), $V_1$ represents a drive voltage applied to the first electrode 14, and $V_2$ represents a drive voltage applied to the fourth electrode 28.

In the evaluation of the static displacement, a static displacement (unit: micrometer (μm)) was measured when $V_1=V_2=10$ V. In the evaluation of the variation in the displacement, when $V_1=V_2$, a drive voltage having a voltage magnitude $V_{pp}$ of 40 V was applied with a sine wave containing no direct current (DC) offset voltage components.

FIG. 9 is a table collectively showing the evaluation results of each of the prepared device samples. In FIG. 9, the unit of $t_1$, $t_2$, and $t_v$ is micrometer (μm). In FIG. 9, "AA" represents an extremely favorable device containing substantially no variation in the displacement. "A" represents a favorable device having a small variation in the displacement which is allowable in practice. "C" represents a device having a large variation in the displacement.

As shown in FIG. 9, a structure having two piezoelectric films shows a higher displacement than a structure having only one piezoelectric film. In addition, the thickness $t_v$ corresponding to the interlayer is 0.3 μm or less, the variation in the displacement is large. When $t_v$ is more than 0.3 μm, the variation in the displacement is improved. $t_v$ is preferably 0.4 μm or more and more preferably 0.5 μm or more.

FIG. 10 shows the results of evaluating warping caused by residual stress. In FIG. 10, the unit of $t_1$, $t_2$, and $t_v$ is micrometer (μm). In FIG. 10, "A" represents a favorable device having substantially no warping, and "C" represents a device having warping.

<Regarding Thickness of Piezoelectric Film>

As can be seen from FIG. 10, regarding a relationship between the thicknesses of the first piezoelectric film 16 and the second piezoelectric film 26 between which the interlayer 22 is interposed, it is preferable that the thickness of the second piezoelectric film is 0.5 times to 2 times the thickness of the first piezoelectric film.

In a case where a device having a device shape such a diaphragm structure or a cantilever structure obtained by etching the silicon substrate 12 is used, warping may occur in the device depending on the usage environment. The main reason why warping occurs is a difference between the thermal expansion coefficients of the piezoelectric material used in the piezoelectric films (16, 26) and the material of the interlayer 22. It is preferable that a ratio of the thickness of the second piezoelectric film 26 to the thickness of the first piezoelectric film 16 is in a range of 0.5 to 2 because a good balance is obtained by the two piezoelectric films (16, 26) between which the interlayer 22 is interposed, and the amount of warpage is relatively small.

In Examples 5 and 6 of FIG. 10, the evaluation of warping is "C", which may be allowable depending on the use of the device.

<Regarding Relationship Between Thickness of Each Layer and Position of Stress Neutral Surface>

In the configuration shown in FIGS. 7 and 8, in a case where a periodic wave (for example, sine wave) drive voltage containing no offset is applied under a condition of $V_1=V_2$, a position x (refer to FIG. 7) of a stress neutral surface positioned by vibration of bending is obtained from the following expression.

$$x = \frac{E_p t(t_2 - t_1)}{2(E_V t_V + E_p t_1 + E_p t_2)} \quad \text{(Expression 1)}$$

In the expression, $E_p$ represents a Young's modulus of a piezoelectric body, and $E_V$ represents a Young's modulus of the interlayer.

In the expression, t represents the total thickness ($t = t_1 + t_2 + t_v$). As shown in FIG. 7, the position x of the stress neutral surface is expressed by the shift amount from the center $t_v/2$ of $t_v$.

A necessary condition for making the stress neutral surface present in the interlayer 22 is that, in FIG. 7, the upper limit of the position of x of the stress neutral surface does not exceed $t_v/2$, that is, a boundary condition is $2_x = t_v$. Therefore, the minimum thickness $t_v$ of the vibration plate is expressed by the following expression.

$$t_V = \frac{-2E_p t_1 + \sqrt{4E_p^2 t_1^2 + 4E_p E_V (t_2 - t_1)(t_2 + t_1)}}{2E_V} \quad (t_2 > t_1) \quad \text{(Expression 2)}$$

$$t_V = \frac{-2E_p t_1 + \sqrt{4E_p^2 t_2^2 - 4E_p E_V (t_2 - t_1)(t_2 + t_1)}}{2E_V} \quad (t_1 > t_2) \quad \text{(Expression 3)}$$

Figure 11:
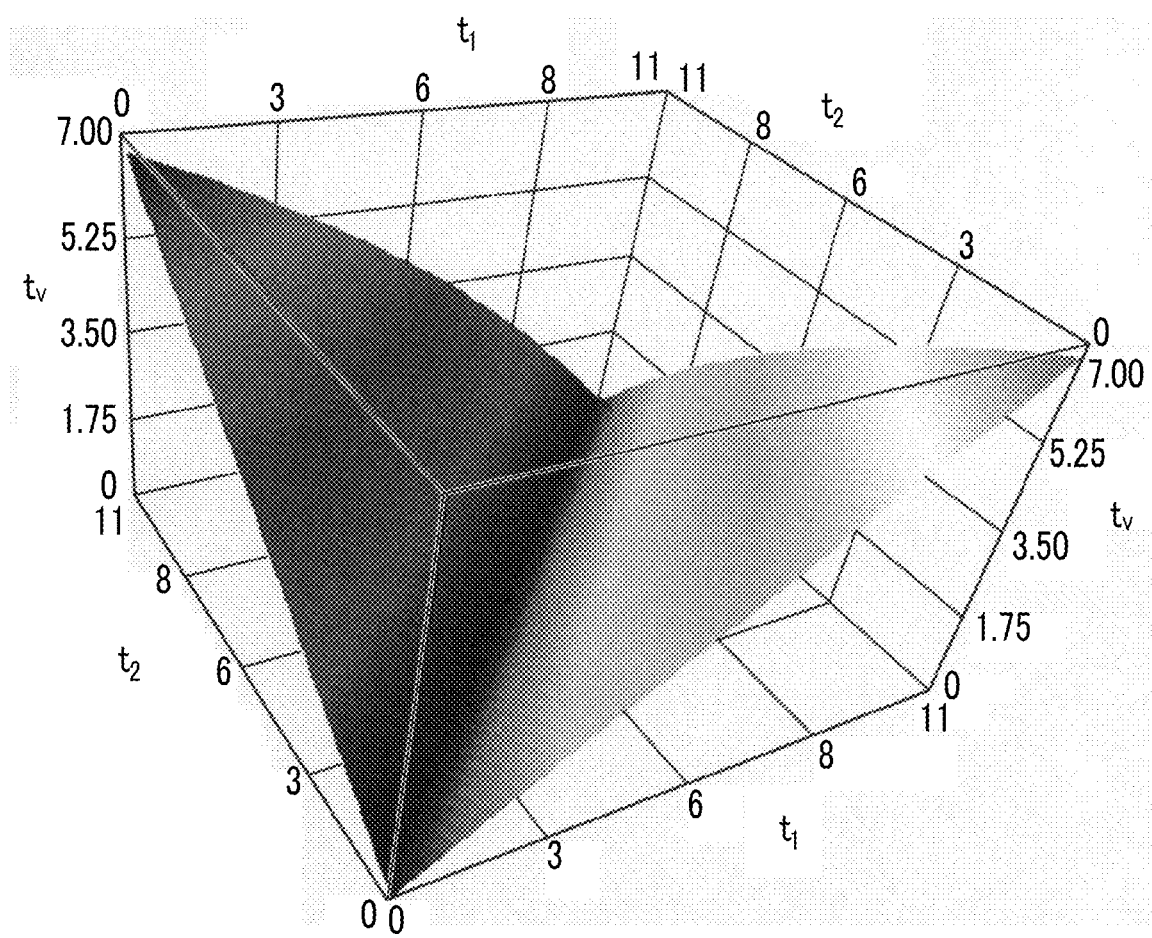
FIG. 11 is a diagram showing a relationship between a thickness ($t_1$) of a first piezoelectric film, a thickness ($t_2$) of a second piezoelectric film, and a necessary thickness ($t_v$) of a vibration plate.

For reference, FIG. 11 is a diagram showing Expressions 2 and 3. In FIG. 11, the unit of each axis is micrometer (μm).

Figure 12:
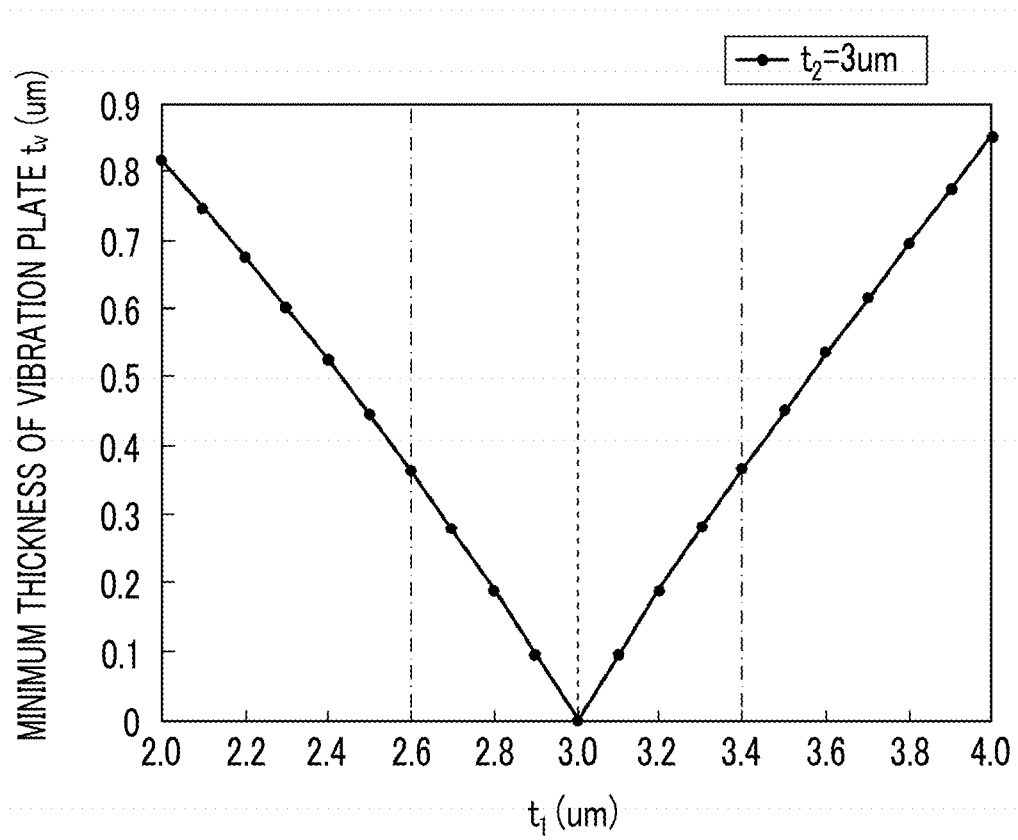
FIG. 12 is a graph showing a relationship of the necessary thickness ($t_v$) of the vibration plate relative to $t_1$ when $t_2=3$ µm in FIG. 11.

FIG. 12 is a graph showing a relationship of the necessary thickness ($t_v$) of the vibration plate relative to $t_1$ when $t_2 = 3$ μm. In a case where a piezoelectric film having a thickness of about 3 μm is formed using a film formation method such as a vapor phase epitaxial method, it is presumed that a variation in thickness is generally about ±10%. In FIG. 12, a variation in thickness was ±13% (±0.4 μm). In consideration of the film thickness accuracy, the thickness of the interlayer necessary for making the stress neutral surface present in the interlayer 22 is 0.4 μm or more (refer to FIG. 12).

Figure 13:
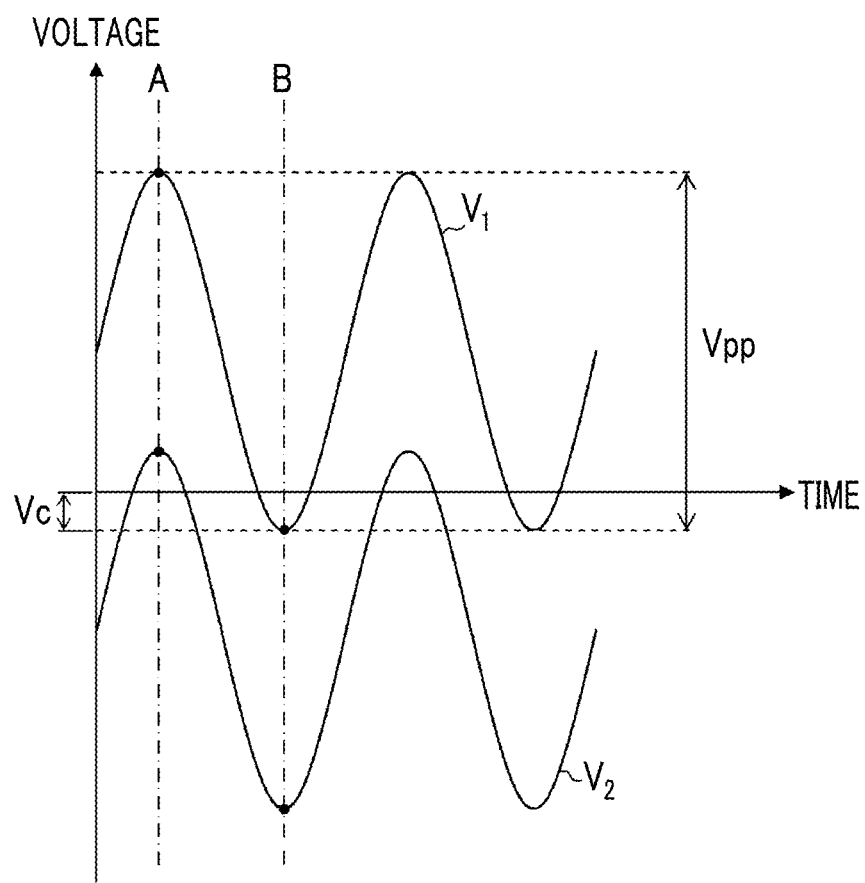
FIG. 13 is a graph showing an example of a waveform of a drive voltage.

In addition, in a case where a high voltage is applied to an actuator in order to obtain a large displacement, a waveform containing an offset voltage (direct current voltage component) Vc shown in FIG. 13 may be applied such that polarization reversal does not occur in the piezoelectric body depending on the applied voltage. As Vc, a voltage value is selected so as not to be higher than a coercive electric field of the piezoelectric body.

In this case, a balance of generative force between the first piezoelectric film 16 and the second piezoelectric film 26 deteriorates, and thus the position of the stress neutral surface changes during driving. For example, a balance of generative force between the first piezoelectric film 16 and the second piezoelectric film 26 varies, for example, at points A and B in FIG. 13. Therefore, in order to make the stress neutral surface always present in the interlayer 22 and to stabilize a driving displacement, the thickness of the interlayer 22 having a sufficient allowance for the change is necessary.

For example, in a configuration in which $t_1 = t_2 = 3$ μm, when the sine wave drive voltages $V_1$ and $V_2$ shown in FIG. 13 in which Vc=8 V and $V_{pp}=40$ V are applied, the position x of the stress neutral surface shifts within a range of ±1 μm. Accordingly, in order to make the stress neutral surface always present in the interlayer, $t_v$ is preferably 2 μm or more.

<Regarding Piezoelectric Material>

Preferable examples of the piezoelectric material according to the embodiment include a material containing one kind or two or more kinds of perovskite type oxides (Formula P).

$$ABO_3 \quad \text{(P)}$$

In Formula P, A represents an A-site element which is at least one element containing Pb. B represents a B-site element which is at least one element selected from the group consisting of Ti, Zr, V, Nb, Ta, Sb, Cr, Mo, W, Mn, Sc, Co, Cu, In, Sn, Ga, Zn, Cd, Fe, and Ni. O represents oxygen.

A standard molar ratio of the A-site element, the B-site element, and oxygen is 1:1:3. However, the molar ratio may deviate from the standard molar ratio in a range where a perovskite structure can be adopted.

Examples of the perovskite type oxide represented by the above formula include a lead-containing compound such as lead titanate, lead zirconate titanate (PZT), lead zirconate, lead lanthanum titanate, lead lanthanum zirconate titanate, lead magnesium niobate-lead zirconate titanate, lead nickel niobate-lead zirconate titanate, or lead zinc niobate-lead zirconate titanate, and a mixed crystal system thereof; and a lead non-containing compound such as barium titanate, strontium barium titanate, bismuth sodium titanate, bismuth potassium titanate, sodium niobate, potassium niobate, lithium niobate, or bismuth ferrite, and a mixed crystal system thereof.

In addition, it is preferable that the piezoelectric film according to the embodiment contains one perovskite type oxide (PX) or two or more perovskite type oxides (PX) represented by the following formula.

$$A_a(Zr_x, Ti_y, M_{b-x-y})_b O_c \quad \text{(PX)}$$

In Formula PX, A represents an A-site element which is at least one element containing Pb.

M represents at least one element selected from the group consisting of V, Nb, Ta, and Sb.

$$0 < x < b, 0 < y < b, 0 \leq b - x - y$$

Although a:b:c=1:1:3 as a standard, the molar ratio may deviate from the standard molar ratio in a range where a perovskite structure can be adopted.

The perovskite type oxide (PX) is pure PZT or an oxide obtained by substituting or a portion of the B-site element in PZT with M. It is known that, in PZT to which various donor ions having a higher valence than substituted ions are added, characteristics such as piezoelectric performance are improved to be higher than those of pure PZT. It is preferable that M represents one kind or two or more kinds of donor ions having a higher valence than tetravalent Zr or Ti ions. Examples of the donor ions include $V^{5+}$, $Nb^{5+}$, $Ta^{5+}$, $Sb^{5+}$, $Mo^{6+}$, and $W^{6+}$.

b-x-y is not particularly limited within a range where a perovskite structure can be adopted. For example, in a case where M represents Nb, a molar ratio of Nb/(Zr+Ti+Nb) is preferably 0.05 to 0.25 and more preferably 0.06 to 0.20.

A piezoelectric film which is formed of the perovskite type oxide represented by Formula (P) or (PX) described above has a high piezoelectric constant (d31 constant). Therefore, a piezoelectric element including the piezoelectric film is superior in displacement characteristics and detection characteristics.

The Pb-based piezoelectric material has been described. However, in the practice of the present invention, a non-lead perovskite type piezoelectric material can also be suitably used.

<Regarding Film Formation Method>

As a method for forming a piezoelectric film, a vapor phase epitaxial method is preferable. For example, various methods such as a sputtering method, an ion plating method, a metal organic chemical vapor deposition (MOCVD) method, or a pulsed laser deposition (PLD) method can be used. In addition, a method other than a vapor phase epitaxial method (for example, a sol-gel method) may be used.

By directly forming a piezoelectric film on a substrate using a sputtering method to reduce the thickness of the piezoelectric film, the manufacturing process can be simplified. In addition, through etching or the like, microfabrication can be easily performed on the piezoelectric film formed as described above, and the piezoelectric film can be patterned into a desired shape. As a result, the yield can be significantly improved, and further reduction in the size of the device can be handled. In the practice of the present invention, the electrode material, the piezoelectric material, the respective thicknesses of the layers, film formation conditions, and the like can be selected according to the purpose.

Modification Example 1

In the above-described description, Si is used as the material of the interlayer 22. However, in another example, a material obtained by adding Ni to Si was used to form the interlayer 22 having the same structure as shown in FIG. 1 using a sputtering method. However, the addition amount of Ni is lower than 50% by mass. Depending on the composition ratio of Si and Ni, the thermal expansion coefficient of the Si—Ni material ranges between the thermal expansion coefficient of Si (2.4 ppm/° C.) and the thermal expansion coefficient of Ni (12.8 ppm/° C.). The interlayer 22 which is formed of the material containing Si as a major component and further containing Ni is conductive and can function as a common electrode for the first piezoelectric film 16 and the second piezoelectric film 26. As long as Si is contained as a major component, a metal element other than Ni may be added or a combination of plural kinds of metal elements may be added to Si.

Modification Example 2

FIG. 1 shows the structure in which the two piezoelectric films (16, 26) are laminated with the interlayer 22 interposed therebetween. In the practice of the present invention, a configuration may be adopted in which three or more piezoelectric films are laminated by further laminating a piezoelectric film on the fourth electrode 28.

Modification Example 3

In a device, either or both of the first piezoelectric film 16 and the second piezoelectric film can operate using a positive piezoelectric effect. In addition, in a device, either or both of the first piezoelectric film 16 and the second piezoelectric film can operate using an inverse piezoelectric effect. In addition, in the single piezoelectric element 10, a portion using a positive piezoelectric effect and a portion using an inverse piezoelectric effect can be combined with each other.

Modification Example 4

The drive voltage applied to the first piezoelectric film 16 and the drive voltage applied to the second piezoelectric film 26 are alternative current and can have driving waveforms having different phases.

<Regarding Use of Device>

As a specific example of using the piezoelectric element according to the embodiment, the piezoelectric element can be applied to various devices having a suitable structure such as an ink jet device, a high-frequency switch, a micromirror, a power generation device, a speaker, a vibrator, a pump, or an ultrasonic probe.

Advantageous Effects of Embodiment

According to the above-described embodiment, there are the following advantageous effects.

(1) In the configuration where the two piezoelectric films are laminated with the interlayer interposed therebetween, the effective performance of the piezoelectric element can be improved as compared to a case where only one (single) piezoelectric film is provided.

For example, in a case where the piezoelectric element having a structure shown in FIG. 1 is used as an actuator, the drive voltage required to obtain a displacement equivalent to that of the configuration where only one (single) piezoelectric film is provided can be reduced to about ½.

That is, in a case where the piezoelectric element 10 according to the embodiment is used as an actuator, a large displacement can be obtained by applying a relatively low drive voltage. In addition, a load on a control circuit including a drive circuit is reduced by a decrease in the drive voltage, and cost reduction, power saving, improvement of durability, and the like can be realized.

In addition, in a case where the piezoelectric element 10 according to the embodiment is used as a sensor, a high voltage signal can be obtained by the piezoelectric films being deformed, and the sensitivity can be improved.

Further, in a case where the piezoelectric element 10 according to the embodiment is used as a power generation device, the power generation voltage can increase by the piezoelectric films being laminated, and the same effect as that of a device whose area is increased in a planar way can be obtained. As a result, a small device having high power generation efficiency can be realized, practically suitable power generation performance can be realized.

(2) By setting the thickness of the interlayer 22 to be 0.4 µm or more and more preferably 2.0 µm or more, the stress neutral surface during bending can be made to be present in the interlayer 22, and the stability of displacement can be improved. In addition, since the rigidity of a movable portion is improved, the piezoelectric element 10 can be used as a driving source of a device having a high resonance frequency. Further, even when the first piezoelectric film 16 and the second piezoelectric film 26 vary in the thickness and the stress, the amount of initial bending is relatively small, and an appropriate operation for a device can be performed.

(3) All the components of the laminate structure shown in FIG. 2 can be prepared through a continuous film formation process and can be manufactured more simply than a process of the related art in which piezoelectric bodies are bonded to each other. As a result, the costs can be reduced.

(4) According to the embodiment, a piezoelectric element having high stability and reliability can be obtained.

The present invention is not limited to the above-described embodiment, and various modifications can be made by those of ordinary skill in the pertinent field within a range not departing from the technical concepts of the present invention.

EXPLANATION OF REFERENCES

10: piezoelectric element
12: silicon substrate

14: first electrode
16: first piezoelectric film
18: second electrode
20: adhesion layer
22: interlayer
24: third electrode
26: second piezoelectric film
28: fourth electrode
32: concave portion

What is claimed is:

1. A method for manufacturing a piezoelectric element, the method comprising:
    forming a first electrode on a silicon substrate;
    forming a first piezoelectric film on the first electrode;
    forming a second electrode on the first piezoelectric film;
    forming an adhesion layer on the second electrode;
    forming an interlayer on the adhesion layer the interlayer being formed of a material including silicon and having a thickness of 0.4 µm to 10 µm;
    forming a third electrode on the interlayer;
    forming a second piezoelectric film on the third electrode;
    forming a fourth electrode on the second piezoelectric film;
    removing a part of the silicon substrate by etching; and
    calculating a minimum thickness of the interlayer G by the following expressions:

$$t_V = \frac{-2E_p t_1 + \sqrt{4E_p^2 t_1^2 + 4E_p E_V (t_2 - t_1)(t_2 + t_1)}}{2E_V} \quad (t_2 > t_1)$$

$$t_V = \frac{-2E_p t_1 + \sqrt{4E_p^2 t_2^2 + 4E_p E_V (t_2 - t_1)(t_2 + t_1)}}{2E_V} \quad (t_1 > t_2)$$

where $t_1$ is a thickness of the first piezoelectric film, $t_2$ is a thickness of the second piezoelectric film, the thickness of at least one of the first piezoelectric film and the second piezoelectric film is calculated while maintaining a thickness variation within a predetermined range according to a film formation method used in the forming of the at least one of the first piezoelectric film and the second piezoelectric film, $E_P$ is a Young's modulus of piezoelectric material used in the piezoelectric films, and $E_v$ is a Young's modulus of the interlayer, wherein
each of the first electrode, the first piezoelectric film, the second electrode, the interlayer, the adhesion layer, the third electrode, the second piezoelectric film, and the fourth electrode is formed using a thin film formation method,
in a bending mode of being bent in a film thickness direction, the interlayer is used as a vibration plate and operates using displacements of the first piezoelectric film and the second piezoelectric film in a piezoelectric constant d31 direction,
a stress neutral surface during the bending is present in the interlayer, and
the forming an interlayer includes forming the interlayer having a thickness of no less than G calculated in the calculating.

2. The method according to claim 1, wherein
a material of the adhesion layer is a transition metal element.

3. The method according to claim 1, wherein
a material of the adhesion layer is a transition metal element oxide.

4. The method according to claim 1, wherein
a material of the adhesion layer is a combination of a transition metal element and a transition metal element oxide.

5. The method according to claim 1, wherein
a material of the interlayer contains silicon.

6. The method according to claim 1, wherein
each of the first piezoelectric film and the second piezoelectric film has a thickness of 0.3 µm to 10 µm.

7. The method according to claim 1, wherein
the first piezoelectric film and the second piezoelectric film have the same crystal orientation.

8. The method according to claim 7, wherein
the first piezoelectric film and the second piezoelectric film have a (100) orientation.

9. The method according to claim 7, wherein
the first piezoelectric film and the second piezoelectric film have a (001) orientation.

10. The method according to claim 1, wherein
a polarization direction of the first piezoelectric film and a polarization direction of the second piezoelectric film are the same.

11. The method according to claim 1, wherein
each of a residual stress of the first piezoelectric film and a residual stress of the second piezoelectric film is 200 MPa or lower in terms of an absolute value.

12. The method according to claim 1, wherein
a thermal expansion coefficient of the interlayer is two times or less thermal expansion coefficients of the first piezoelectric film and the second piezoelectric film.

13. The method according to claim 1, wherein
a thickness of the second piezoelectric film is 0.5 times to 2 times a thickness of the first piezoelectric film.

14. The method according to claim 1, wherein
each of the first electrode, the first piezoelectric film, the second electrode, the interlayer, the adhesion layer, the third electrode, the second piezoelectric film, and the fourth electrode is formed using a thin film formation method.

15. The method according to claim 14, wherein
the thin film formation method is a vapor phase epitaxial method.

* * * * *